United States Patent
Wu et al.

(10) Patent No.: US 11,307,276 B2
(45) Date of Patent: Apr. 19, 2022

(54) USE OF A SPACER BETWEEN LAYERED COIL SECTIONS IN A SUPERCONDUCTING MAGNET STRUCTURE

(71) Applicant: General Electric Company, Schenectady, NY (US)

(72) Inventors: Anbo Wu, Clifton Park, NY (US); Ye Bai, Schenectady, NY (US); Minfeng Xu, Ballston Lake, NY (US); Paul St. Mark Shadforth Thompson, Stephentown, NY (US); Mark Ernest Vermilyea, Schenectady, NY (US); Michael Parizh, Latham, NY (US)

(73) Assignee: General Electric Company, Schenectady, NY (US)

( * ) Notice: Subject to any disclaimer, the term of this patent is extended or adjusted under 35 U.S.C. 154(b) by 344 days.

(21) Appl. No.: 16/597,635

(22) Filed: Oct. 9, 2019

(65) Prior Publication Data

US 2021/0109175 A1   Apr. 15, 2021

(51) Int. Cl.
| | |
|---|---|
| *G01R 33/3815* | (2006.01) |
| *G01R 33/38* | (2006.01) |
| *H01F 6/06* | (2006.01) |
| *H01F 41/04* | (2006.01) |
| *G06F 30/398* | (2020.01) |

(52) U.S. Cl.
CPC ..... *G01R 33/3815* (2013.01); *G01R 33/3802* (2013.01); *G06F 30/398* (2020.01); *H01F 6/06* (2013.01); *H01F 41/048* (2013.01)

(58) Field of Classification Search
CPC ............ G01R 33/3815; G01R 33/3802; G06F 30/398; H01F 6/06; H01F 41/048
See application file for complete search history.

(56) References Cited

U.S. PATENT DOCUMENTS

| | | | |
|---|---|---|---|
| 4,935,714 | A | 6/1990 | Vermilyea |
| 5,389,909 | A | 2/1995 | Havens |
| 6,014,069 | A | 1/2000 | Havens et al. |
| 7,495,441 | B2 | 2/2009 | Amor et al. |
| 7,683,624 | B2 | 3/2010 | Tamura |
| 9,953,764 | B2 | 4/2018 | Dunckley et al. |
| 10,292,618 | B2 | 5/2019 | Nevala et al. |
| 2006/0284711 | A1* | 12/2006 | Atkins ............... H01F 6/06 335/216 |
| 2007/0247263 | A1* | 10/2007 | Calvert ............ G01R 33/381 335/216 |

OTHER PUBLICATIONS

Avdievich, Nikolai I., et al.; "Improved Homogeneity of the Transmit Field by Simultaneous Transmission with Phased Array and Volume Coil", Journal of Magnetic Resonance Imaging, vol. 32, pp. 476-481, Jul. 22, 2010.
Gilbert, Eric, et al.; "An asymmetric split-pair superconducting magnet for nuclear polarization experiments", Journal of Physics E: Scientific Instruments, Feb. 3, 1073, vol. 6, Issue 8, pp. 714-718.

* cited by examiner

*Primary Examiner* — G. M. A Hyder (57) ABSTRACT

A magnetic resonance imaging device is described that includes multiple magnetic coils to generate a magnetic field. Additionally, the magnetic resonance imaging device may include one or more radial gaps within some or all of the magnetic coils (e.g., primary magnetic coils, bucking coils, and so forth) in which radial spacers may be located to help preserve the homogeneity of the magnetic isocenter of the primary magnetic coils during operation.

18 Claims, 5 Drawing Sheets

USE OF A SPACER BETWEEN LAYERED COIL SECTIONS IN A SUPERCONDUCTING MAGNET STRUCTURE

STATEMENT REGARDING FEDERALLY SPONSORED RESEARCH & DEVELOPMENT

This invention was made with Government support under contract number U01 EB026976-01 awarded by the National Institute of Health (NIH). The Government has certain rights in the invention.

BACKGROUND

The subject matter disclosed herein relates to the use of spacing elements in a magnet coil structure.

Non-invasive imaging technologies allow images of the internal structures or features of a patient/object to be obtained without performing an invasive procedure on the patient/object. In particular, such non-invasive imaging technologies rely on various physical principles (such as the differential transmission of X-rays through a target volume, the reflection of acoustic waves within the volume, the paramagnetic properties of different tissues and materials within the volume, the breakdown of targeted radionuclides within the body, and so forth) to acquire data and to construct images or otherwise represent the observed internal features of the patient/object.

For example, magnetic resonance imaging (MRI) examinations are based on the interactions among a primary magnetic field, a radiofrequency (RF) magnetic field, and time varying magnetic gradient fields with gyromagnetic material within a subject of interest, such as a patient. Certain gyromagnetic materials, such as hydrogen nuclei in water molecules, have characteristic behaviors in response to external magnetic fields. The precession of spins of these nuclei can be influenced by manipulation of the fields to produce RF signals that can be detected, processed, and used to reconstruct a useful image.

During imaging sequences, time varying gradient fields and RF fields are generated by the application of current to a series of gradient coils and RF coils, respectively. Additionally, the primary magnetic field is generated by a permanent magnet or the application of current to a set of primary coils. The primary magnetic field is generally uniform and of significant strength (e.g., 0.5 Tesla (T), 1 T, 2 T, and so on). Superconducting coils may be used to produce high strength magnetic fields such as 1.5 T, 3 T, 7 T, or greater.

In the context of MRI magnets composed of superconducting coils, the width, thickness, and electromagnetic center of each superconducting coil contributes to the primary magnetic field (BO) homogeneity of MRI magnet. It is desirable in imaging (and other) contexts for an MRI magnet to have high homogeneity so that undesirable image artifacts are decreased. Thus, it is desirable to have magnetic field generating structures that provide such high homogeneity when in use.

BRIEF DESCRIPTION

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

In accordance with one embodiment, a magnetic resonance (MR) imaging system is provided. In accordance with this embodiment, the MR imaging system comprises an MR scanner communicatively coupled to control and analysis circuitry. The MR scanner comprises: a plurality of main coil windings configured to generate a primary magnetic field along a magnetic isocenter of the MR scanner; and one or more shielding coil windings configured to generate a shielding magnetic field with respect to the primary magnetic field. At least one coil winding of one or both of the main coil windings or shielding coil windings comprises one or more radial gaps dividing the respective coil winding into at least an inner coil winding segment and an outer coil winding segment. The MR scanner further comprises: a radial spacer located in each radial gap. One or more of the size, geometry, or composition of the respective radial spacers are selected to preserve the homogeneity of the magnetic field along the magnetic isocenter during operation.

In accordance with a further embodiment, a method is provided for magnetic coil design. In accordance with this method, one or more magnetic design analysis routines are executed based on one or more magnet design inputs. The magnet design inputs comprise performance characteristics for a target magnetic field. An output is obtained of the one or more magnetic design analysis routines, wherein the output comprises a respective geometry of each magnetic coil of a plurality of coils of a magnetic coil structure to be fabricated. Based on the respective geometry of each magnetic coil of the plurality of coils, a geometry is determined of one or more radial gaps to be formed within one or more magnetic coils of the plurality of coils so as to maintain magnetic field homogeneity of the magnetic coil structure during operation In accordance with another embodiment, a method for winding a magnetic coil structure is provided. In accordance with this embodiment, for a first magnetic coil of the magnetic coil structure, a first coil segment is wound having a first inner diameter and a first outer diameter. One or both of a thickness of the first coil segment or the first outer diameter of the first coil segment are measured. Based on the thickness or the first outer diameter, a thickness of a radial gap to be formed in the first coil segment that will improve the field homogeneity of the entire coil set is determined. A radial spacer is formed in the radial gap. The thickness of the radial spacer corresponds to the radial gap thickness. A second coil segment is wound over the radial spacer. The second coil segment has a second inner diameter and a second outer diameter.

BRIEF DESCRIPTION OF THE DRAWINGS

These and other features, aspects, and advantages of the present invention will become better understood when the following detailed description is read with reference to the accompanying drawings in which like characters represent like parts throughout the drawings, wherein.

DETAILED DESCRIPTION

One or more specific embodiments of the present invention will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," "the," and "said" are intended to mean that there are one or more of the elements. The terms "comprising," "including," and "having" are intended to be inclusive and mean that there may be additional elements other than the listed elements. Furthermore, any numerical examples in the following discussion are intended to be non-limiting, and thus additional numerical values, ranges, and percentages are within the scope of the disclosed embodiments.

Some generalized information is provided for both general context related to aspects of the present disclosure and to facilitate understanding and explanation of certain of the technical concepts described herein.

In general, magnetic resonance imaging (MRI) is based on the interactions of a primary magnetic field, time varying magnetic gradient fields, and a radiofrequency (RF) field with gyromagnetic material within a subject of interest (e.g., a patient). Certain gyromagnetic materials, such as hydrogen nuclei in water molecules, have characteristic behaviors in response to external electromagnetic (EM) fields (e.g., constant or time varying electric fields, magnetic fields, or a combination thereof). The precession of spins of these nuclei can be influenced by manipulation of the fields to produce RF signals that can be detected, processed, and used to reconstruct a useful image.

As MRI magnets increase in strength, it is important that the primary magnetic field of the MRI magnet is homogenous. An inhomogeneous magnetic field, in an imaging context, may decrease the resolution of the images generated using an MRI system. In such a circumstance, it may be difficult, and expensive, to repair or modify the MRI system to produce a suitably homogeneous field under operating conditions. As discussed herein, methods and systems are described for increasing the homogeneity of MRI magnets in the design and winding process of the magnet, thereby addressing certain of these issues.

By way of example, in certain embodiments, potential magnetic field inhomogeneity caused by coil winding build up error is corrected or otherwise addressed. In one such example, during the magnet design phase a radial spacer element is included in the design between inner and outer radial sections of MRI superconducting coils, such as primary field generating coils and/or bucking coils. During the winding of the coils during manufacture, the radial spacer thickness can be adjusted to be thicker or thinner based upon the observed or measured thickness of the inner coil (assuming a winding proceeding from inward to outward in the radial direction), thereby accounting for the actual build-up or thickness of the earlier wound segments. Thus, if the inner coil is thicker than specified by design, the radial gap between the inner/outer sections may be reduced to preserve the radial EM center of the combined inner and outer coils. Alternatively, if the inner coil is thinner than designed, the radial gap may be enlarged to keep the EM center per the EM analysis and design. In this manner, a MRI magnet may be manufactured that can reliably provide a more homogenous magnetic field during operation without having to resort to shimming or other post hoc structure adjustment solutions. In particular, the technique described herein may be particularly beneficial in the fabrication of high field magnetic coil structures, such as 7 T MRI magnets.

With the preceding in mind, and as discussed herein, in accordance with certain implementations, at least one of the superconducting coils (e.g., a primary coil or bucking coil) is radially divided into inner and outer coil sections. One or more radial spacers are positioned between the inner and outer coil sections. Each radial spacer is configured (e.g., designed, sized, oriented, and so forth) based on magnet design analysis, such as using the nominal thickness of each designed inner and outer coil segment. During the coil winding process, the actual radial spacer thickness can be adjusted according to the actual (e.g., measured or otherwise determined observed) thickness of the wound inner coil so as to maintain the electromagnetic center of the combined inner and outer coils as designed. A look-up table may be prepared before the coil winding so that the radial spacer thickness can be readily determined, which may help reduce total winding time.

As set forth above, the embodiments described herein may be implemented as a part of an MRI system, wherein specific imaging routines are initiated by a user (e.g., a radiologist). Thus, the system may perform data acquisition, data reconstruction, and in certain instances, image synthesis. Accordingly, referring to FIG. 1, an imaging system 10 is illustrated schematically as including a scanner 12, scanner control circuitry 14, and system control circuitry 16.

Figure 1:
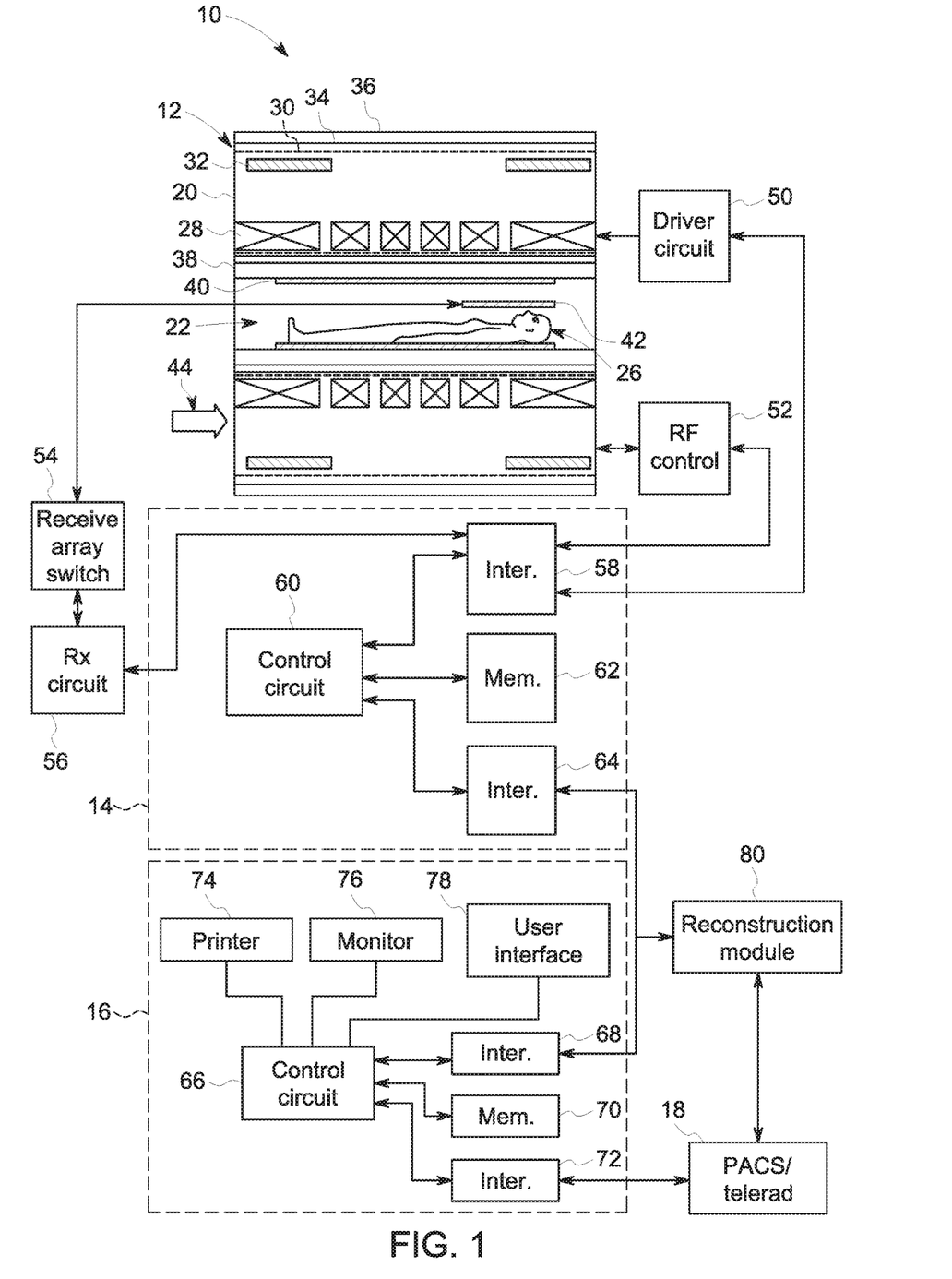
FIG. 1 illustrates a magnetic resonance imaging (MM) system having a scanner and an image reconstruction unit, in accordance with an embodiment of the present disclosure.

The imaging system 10 additionally includes remote access and storage systems 18 and/or devices such as picture archiving and communication systems (PACS), or other devices such as teleradiology equipment so that data acquired by the imaging system 10 may be accessed on- or off-site. In this way, MRI data may be acquired, followed by on- or off-site processing and evaluation. While the imaging system 10 may include any suitable scanner or detector, in the illustrated embodiment, the imaging system 10 includes a full body scanner 12 having a housing 20 through which an opening (e.g., an annular opening) is formed to accommodate a bore tube 22. The bore tube 22 may be made of any suitable material such as a non-metallic and/or non-magnetic material. A table 24 is moveable into the bore tube 22 to permit a patient 26 to be positioned therein for imaging selected anatomy within the patient. In some embodiments, the bore tube 22 may surround an entire subject or just a portion thereof (e.g., a patient's head, thorax, or extremity). In some embodiments, the bore tube 22 may support the table 24 and/or articulation components (e.g., a motor, pulley, and/or slides).

The scanner 12 may include a series of associated conductive coils for producing controlled electromagnetic fields for exciting the gyromagnetic material within the anatomy of the subject being imaged. Specifically, primary magnet coils 28 are provided for generating a primary magnetic field, which is generally aligned with the bore tube 22. The primary magnetic coils 28 and shielding coils 32 may be made of a superconductor, which during operation, may generate the primary magnetic field to strengths greater than 1 Tesla. To maintain temperatures for the superconducting properties of the coils 28, 32 to function properly, in some embodiments, a thermal shield 34 and a vacuum vessel 36 encloses the coils 28, 32. The vacuum vessel 36 may enclose the thermal shield 34 to reduce convective heat into the coils 28, 32 and other structures in the housing 20 that need to be maintained at cryogenic temperatures. The thermal shield 34 (e.g. radiation shield) maintains a cryogenic temperature (e.g., 40-60 K) and serves to reduce radiation heat load to the coils 28, 32 and other structures in the housing 20 that require cryogenic temperatures for operation. Also, in some MR magnets, such as a helium-bath-cooled magnet, a cryogen (e.g. helium) vessel 30 may help the coils maintain a low temperature (e.g. 4.2 K). In other embodiments of MRI magnets, such as in a conduction-cooled or thermosiphon-cooled magnet, a helium vessel 30 may not be necessary to maintain a cryogenic temperature.

A series of gradient coils collectively 38 permit controlled magnetic gradient fields to be generated for positional encoding of certain of the gyromagnetic nuclei within the patient 26 during examination sequences. Additionally, an RF coil 40 may generate radio frequency pulses for exciting the certain gyromagnetic nuclei within the patient 26. In addition to the coils that may be local to the scanner 12, the imaging system 10 may also include a set of receiving coils 42 (e.g., an array of coils) to be placed proximal to (e.g., against) the patient 26. As an example, the receiving coils 42 can include cervical/thoracic/lumbar (CTL) coils, head coils, single-sided spine coils, and so forth. Generally, the receiving coils 42 are placed close to or on top of the patient 26 so as to receive the weak RF signals (e.g., weak relative to the transmitted pulses generated by the scanner coils) that are generated by certain of the gyromagnetic nuclei within the patient 26 as they return to their relaxed state. In some embodiments, the RF coils 40 may both transmit and receive RF signals accomplishing the role of the receiving coils 42. In other embodiments, the receiving coils 42 may be able to transmit RF signals to RF coils 40.

The various coils of the imaging system 10 may be situated within the housing 20 of the scanner 12, and are controlled by external circuitry to generate the desired field and pulses, and to read emissions from the gyromagnetic material in a controlled manner. In the illustrated embodiment, a main power supply 44 provides power to the primary magnetic coils 28 to generate the primary magnetic field. A driver circuit 50 may include amplification and control circuitry for supplying current to the coils as defined by digitized pulse sequences output by the scanner control circuitry 14.

An RF control circuit 52 is provided for regulating operation of the RF coil 40. The RF control circuit 52 includes a switching device for alternating between the active and inactive modes of operation, wherein the RF coil 40 transmits and does not transmit signals, respectively. The RF control circuit 52 may also include amplification circuitry to generate the RF pulses. Similarly, the receiving coils 42, or RF coils 40 if no separate receiving coils 42 are implemented, are connected to a switch 54, which is capable of switching the receiving coils 42 between receiving and non-receiving modes. Thus, the receiving coils 42 may resonate with the RF signals produced by relaxing gyromagnetic nuclei from within the patient 26 while in the receiving mode, and avoid resonating with RF signals while in the non-receiving mode. Additionally, a receiving circuit 56 may receive the data detected by the receiving coils 42 and may include one or more multiplexing and/or amplification circuits.

It should be noted that while the scanner 12 and the control/amplification circuitry described above are illustrated as being connected by single lines, one or more cables or connectors may be used depending on implementation. For example, separate lines may be used for control, data communication, power transmission, and so on. Further, suitable hardware may be disposed along each type of line for the proper handling of the data and current/voltage. Indeed, various filters, digitizers, and processors may be disposed between the scanner 12 and the scanner control circuitry 14 and/or system control circuitry 16.

As illustrated, the scanner control circuitry 14 includes an interface circuit 58, which outputs signals for driving the gradient field coils 38 and the RF coil 40 and for receiving the data representative of the magnetic resonance signals produced in examination sequences. The interface circuit 58 may be connected to a control and analysis circuit 60. The control and analysis circuit 60 executes the commands to the driver circuit 50 and the RF control circuit 52 based on defined protocols selected via system control circuitry 16.

The control and analysis circuit 60 may also serve to receive the magnetic resonance signals and perform subsequent processing before transmitting the data to system control circuitry 16. Scanner control circuitry 14 may also include one or more memory circuits 62, which store configuration parameters, pulse sequence descriptions, examination results, and so forth, during operation.

A second interface circuit 64 may connect the control and analysis circuit 60 to a system control circuit 66 for exchanging data between scanner control circuitry 14 and system control circuitry 16. The system control circuitry 16 may include a third interface circuit 68, which receives data from the scanner control circuitry 14 and transmits data and commands back to the scanner control circuitry 14. As with the control and analysis circuit 60, the system control circuit 66 may include a computer processing unit (CPU) in a multi-purpose or application specific computer or workstation. System control circuit 66 may include or be connected to a second memory circuit 70 to store programming code for operation of the imaging system 10 and to store the processed coil data for later reconstruction, display and transmission. The programming code may execute one or more algorithms that, when executed by a processor, are configured to perform reconstruction of acquired data.

An additional input output (I/O) interface 72 may be provided for exchanging coil data, configuration parameters, and so forth with external system components such as remote access and storage systems 18. Finally, the system control circuit 66 may be communicatively coupled to various peripheral devices for facilitating an operator interface and for producing hard copies of the reconstructed images. In the illustrated embodiment, these peripherals include a printer 74, a monitor 76, and a user interface 78 including, for example, devices such as a keyboard, a mouse, a touchscreen (e.g., integrated with the monitor 76), and so forth.

In some embodiments, a reconstruction module 80 may be implemented to reconstruct coil data into a viewable image. Furthermore, the reconstruction module 80 may be implemented as software to be executed by one or more processors of a computer system. Additionally or alternatively, the reconstruction module may include a computer, including memory and one or more processors, on which software modules may be run. Reconstructed images may be sent, for example, to a storage system 18 and/or to the monitor 76 for viewing.

Figure 2:
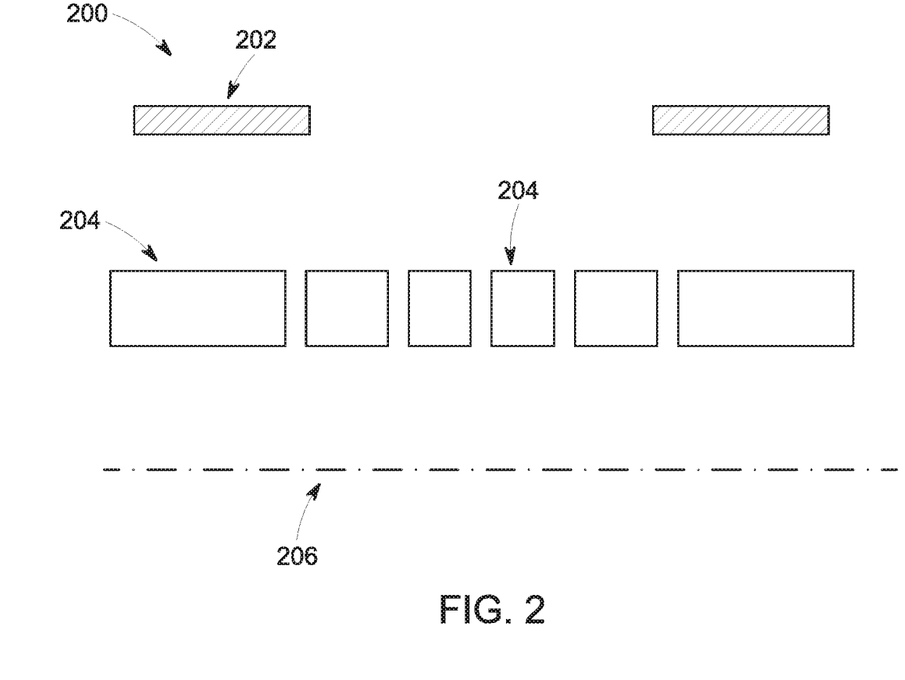
FIG. 2 illustrates a cross-section sketch of a MRI magnet, in accordance with an embodiment of the present disclosure.

With the preceding generalized discussion of aspects on an MRI system 10 in mind, FIG. 2 displays a simplified cross-section type representation of a typical MRI magnetic coil structure 200 as may be seen if one were to take a longitudinal slice through a wall of the cylindrical coil structure. In this example, the depicted MRI magnetic coil structure 200 includes six main or primary superconducting coils 204 as well as radially offset bucking (i.e., shielding) coils 202. The bucking coils 202 may serve to isolate the magnetic system of the MR magnets from environmental magnetic influences (e.g. the earth's magnetic field) or, conversely, shield the environment from the magnetic field generated by the main superconducting coils 204. Moreover, the main superconducting coils 204 are characterized as being located at a substantially similar radial distance measured from the magnetic isocenter 206 or other axis of the bore. As depicted, however, different coil structures of the main superconducting coils 204 may vary in their longitudinal placement along the bore, as illustrated in FIG. 2 by the different positioning of the different coils 204 along the direction defined by the magnetic isocenter 206, which typically runs substantially through the center of the imaging bore.

During operation, the main superconducting coils 204 generate a magnetic field that per design, is intended to have a consistent magnetic isocenter 206 within the bore of the MR magnet 200 that is intended to remain homogeneous when in use. However, in practice it may be difficult to fabricate a MR magnet that has a homogeneous magnetic field (i.e., consistent magnetic isocenter 206) when in use due to the variation of coil diameter and thickness that are introduced in the coil winding process and to fluctuations in the coil windings and overall structure that may occur in response to thermal contraction or expansion or other effects of current passing through the coil structure during operation. In particular, the width, thickness and electromagnetic center of each of the superconducting coils contribute to the magnetic field homogeneity of MRI magnet 200 and these factors may change or otherwise vary when in use, particularly in the context of a magnetic coil structure used to generate a high magnetic field. For example, the higher the main magnetic field (e.g. 7 T), the thicker the superconducting coils become, and the radial thickness of thicker coils may vary or fluctuate more during use, leading to poor BO field homogeneity.

Figure 3:
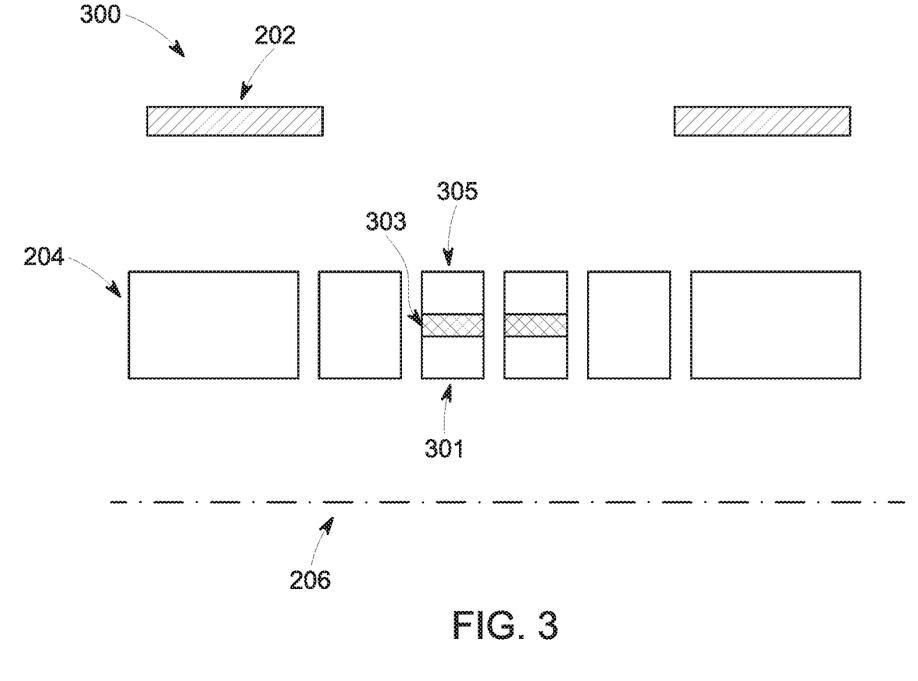
FIG. 3 illustrates a cross-section sketch of an MRI magnet wherein a single pair of main superconducting coils are segmented with a radial spacer between inner and outer sections, in accordance with an embodiment of the present disclosure.

With this in mind, FIG. 3 displays a simplified cross-section type representation of a typical MRI magnetic coil structure 300 as shown in FIG. 2, which includes a radial spacer 303 in one pair of the main superconducting coils 204. In this example, one of the primary coils 204 is radially split so as to have a gap between its inner coil section(s) 301 and the corresponding outer coil section(s) 305. The radial spacer 303 is formed or otherwise positioned within the gap between the inner coil section(s) 301 and outer coil section(s) 305. This spacer 303 may serve to help prevent a magnetic inhomogeneity from arising during operation of the coil due to changes in the dimensions or configuration of the coil during operation that can be foreseen during the magnet design and/or coil winding process. The inner coil section 301 and outer coil section 305 are electrically connected, such as being formed by a single or spanning conductive element or by having a separate conductive element linking the coil sections 301 and 305.

Figure 4:
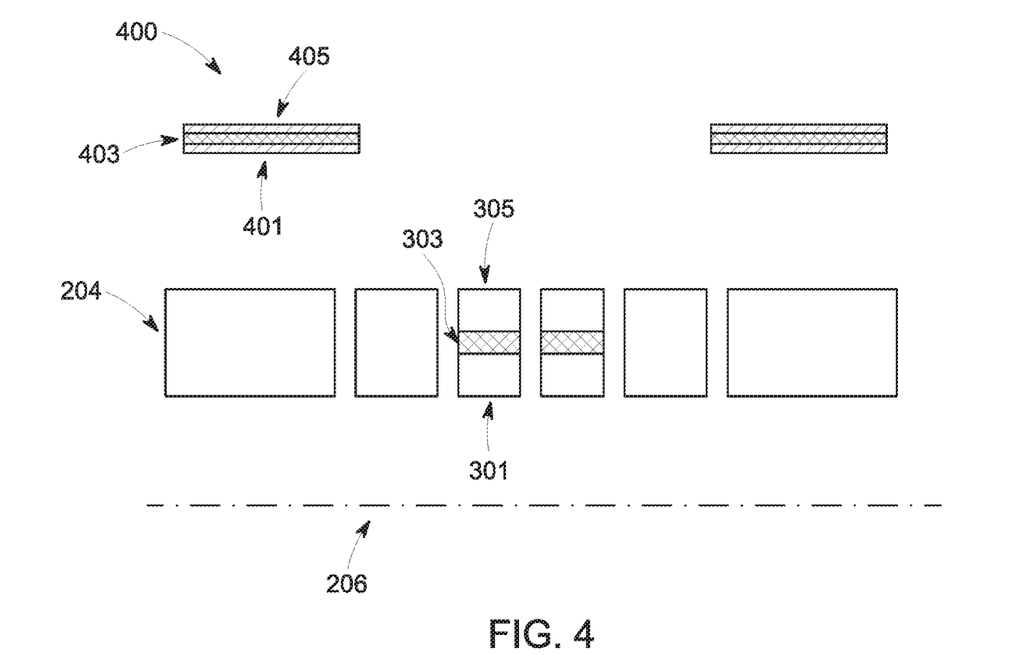
FIG. 4 illustrates a cross-sectional sketch of an MRI magnet wherein a pair of main superconducting coils and a pair of bucking coils are segmented with a radial spacer between inner and outer sections, in accordance with an embodiment of the present disclosure.

Further, gaps and corresponding spacers may also be provided in the bucking coils 202 to maintain homogeneity of the magnetic field associated with the operation of the bucking (i.e., shielding) coils 202 during operation. FIG. 4 illustrates, a magnetic coil structure 400, which has a radial spacer 403 within a pair of bucking coils. The spacer 403 may separate an inner segment 401 of a bucking coil from an outer segment 405 of a bucking coil. The spacer 403 in the bucking coils may help improve the homogeneity of the primary magnetic field or of another magnetic field with which the bucking coils are associated. Thus, as contemplated herein, radial spacers may be located in the main superconducting coils and/or in the bucking coils. The radial spacers in the bucking coils may be composed of an identical or different substance as radial spacers used in the primary coils.

With the preceding in mind, in one implementation, the spacer 303 is formed in or otherwise provided in a radial gap that is determined or otherwise planned for in the electromagnet design, such as to accommodate changes or variations occurring in the coil as a result of the winding process and/or as a result of operating conditions (e.g., heat, current, and so forth). The radial gap within which the radial spacer is positioned, being the radial distance between an inner coil and an outer coil, may be adjusted or determined in the fabrication process by measuring the inner coil outer diameter and radial thickness after finishing the inner coil winding. Based upon the measurements of the inner coil's outer diameter and radial thickness, the dimensions of the radial gap, and corresponding spacer 303, may be determined. Based upon the type of superconducting coil (e.g. epoxy-impregnated, wet-wound, dry-wound cryo-stable), the composition of the radial spacer 303 may be determined. For instance, epoxy-impregnated or wet-wound superconducting coils may benefit from or be suitable for use with radial spacers 303 that are made of fiberglass soaked with epoxy, or porous fiberglass reinforce plastic sheet infused with epoxy, or another substance. Conversely, a dry wound cryo-stable superconducting coil may benefit from or be suitable for use with a radial spacer 303 that is made of stacks of mylar sheets or other electrically insulated and mechanically strong materials.

Figure 5:
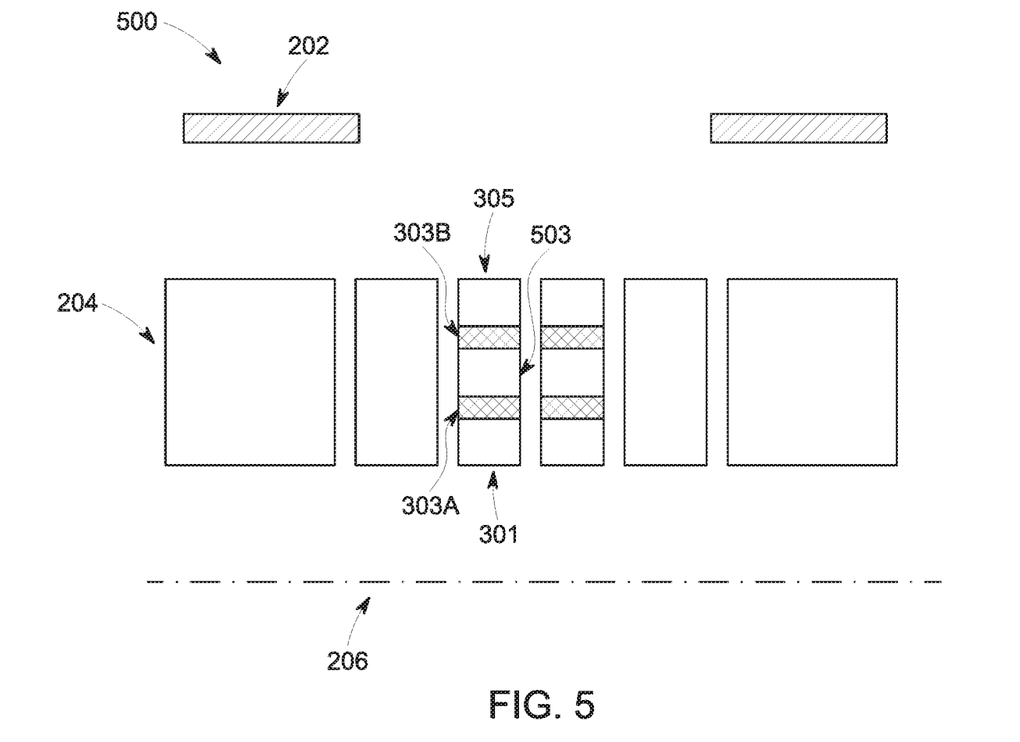
FIG. 5 is a cross-section of an MRI magnet wherein a pair of main superconducting coils are segmented with two radial spacers between inner and outer sections, in accordance with an embodiment of the present disclosure.

In a further example, FIG. 5 displays a simplified cross-section type representation of a typical MRI magnetic coil structure 500 as shown in FIG. 2 that has two radially offset split regions in two of the main superconducting coils 204. In this example, inner radial spacer 303A is radially closer to the axial center (e.g., magnetic isocenter 206) and is located between the inner coil section 301 and a middle coil section 304 of a main superconducting coil 204. Similarly, in this example the outer radial spacer 303B is radially further from the axial center (e.g., magnetic isocenter 206) and is located between the middle coil section 503 and the outer coil section 305 of the main superconducting coil 204 in question. As in the preceding example, the inner coil section 301, the middle coil section 503, and the outer coil section 305 are electrically connected, either by being formed as a single or limited number of conductive elements forming an integral winding or by being connected by one or more conductive elements or connectors. Likewise, the composition of the radial spacers 303A, 303B may be in accordance with the prior example discussion.

Further, as in the preceding example, the dimensions (e.g., thickness) of the spacers 303A, 303B and the corresponding radial gaps in which the spacers are positioned may be determined in the magnet design phase and/or as part of the winding or fabrication phase, with in both contexts a goal of maintaining magnetic field homogeneity of the primary magnetic field during operation. In the present example, inclusion of more than one radial spacer 303A, 303B during the electromagnetic design and/or coil winding processes may improve the adjustability and flexibility of the approach and allow a finer degree of control or configurability to the process, and thus may improve the final field homogeneity during operation. Further, it should be appreciated that, though the preceding pair of examples depict only a single pair of coil structures having a radial gaps and spacers within the structure, in other examples, and as shown below, the gaps and spacers may be present throughout the magnetic coil structure and/or in different coil structures than what is shown in the preceding examples, (e.g., in the outer or intermediary coil structures). In addition, not every coil structure in which a gap or gaps and corresponding spacer(s) are present need be configured the same. For example, certain of the coil structures may have a different thickness or number of gaps and spacers than other coil structures, with an overall goal in the magnet design and fabrication phase of maintaining magnetic field homogeneity during operation.

Figure 6:
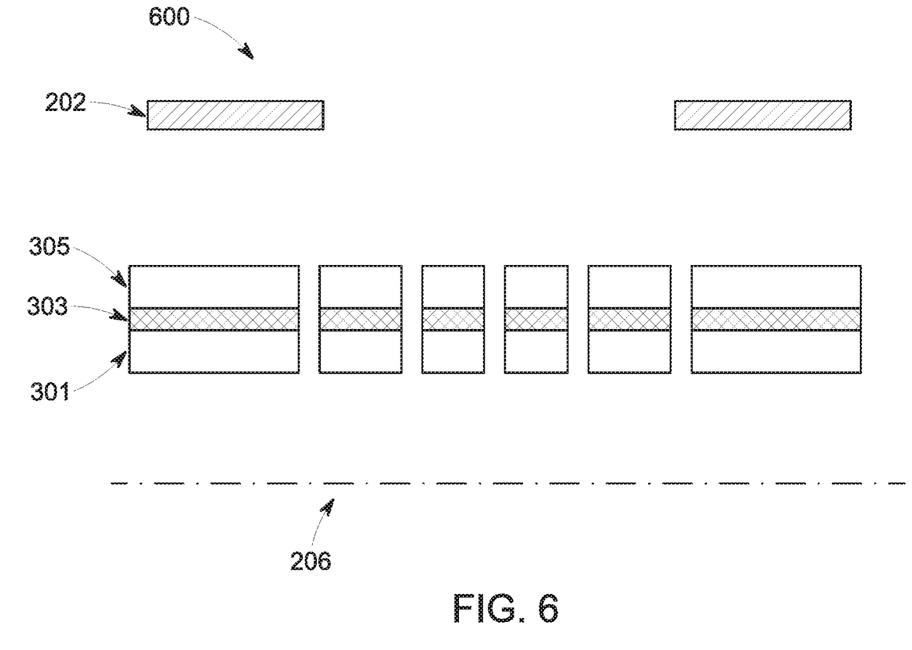
FIG. 6 is a cross-sectional view of an MRI magnet wherein the main superconducting coils are segmented with a radial spacer between inner and outer sections, in accordance with an embodiment of the present disclosure.
Figure 7:
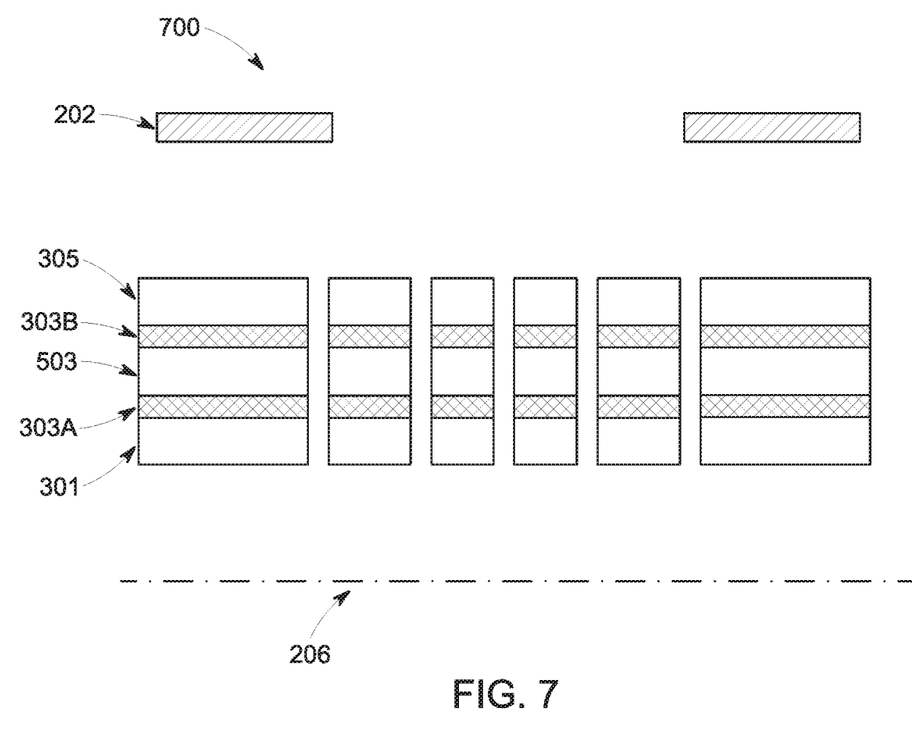
FIG. 7 is a cross-section of an MRI magnet wherein the main superconducting coils are segmented with two radial spacers between inner and outer sections section of the main superconducting coils, in accordance with an embodiment of the present disclosure.

With the preceding in mind, FIGS. 6 and 7 display additional examples of simplified cross-section type representations of a typical MRI magnetic coil structure 600, 700 as shown in FIGS. 3 and 4 but with a radial spacer element(s) (reference number 303 in FIG. 6 and 303A, 303B in FIG. 7) extending through each of the paired main superconducting coils. As shown, in FIG. 6 a single radial spacer 303 is provided within each separate coil stack, similar to FIG. 3, while in FIG. 7 a pair of radial spacers 303A, 303B is present in each separate coil stack of the main superconducting coil. Though for convenience each radial spacer in the different paired superconducting elements is shown as the same thickness and at the same radial offset, in practice, different spacers, even within the same overall magnetic coil structure, may be of different thicknesses and/or radial heights or offsets. Further, though for the purpose of illustration the depicting of single and paired spacers is done separately, in certain implementations paired spacers and single spacers may both be present in the same overall magnetic coil structure, such as in different paired coil elements.

Figure 8:
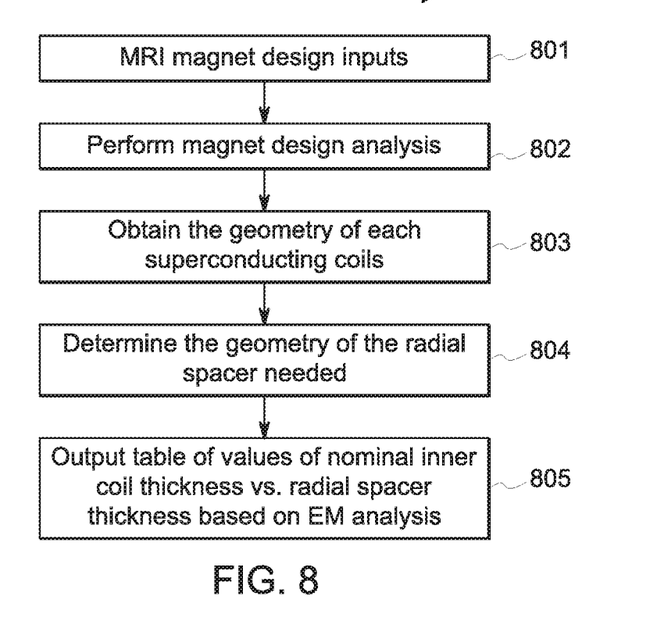
FIG. 8 is a flow chart of an MRI magnet design workflow, in accordance with an embodiment of the present disclosure.

Turning now to FIG. 8, a flow chart is depicted illustrating steps of a magnet design workflow 800. In block 801, the desired MRI magnet characteristics (e.g., the performance characteristics of the magnet being designed) are provided as an input. Based on the design or performance characteristics, at block 802, magnet design analysis is performed, such as using one or more automated and process-implemented routines suitable for determining magnet coil and winding parameters capable of delivering the performance characteristics specified at step 801. Based on the magnet design analysis, at block 803, the geometry (e.g. length, width, thickness, etc.) of each superconducting coil that is to be included in the MRI magnet coil structure is obtained. Based on the geometry of each superconducting coil, in block 804, the geometry (e.g., thickness, radial position, and so forth) of the radial spacer needed to preserve the magnetic isocenter of the MRI magnet may be determined. In the depicted example, steps 801-804 may be repeated for different magnet design inputs to generate, at block 805, a look up table of values of nominal inner coil thickness corresponding to radial spacer thickness based on EM analysis. As will be shown below, this table outputted in block 805 may be utilized in the coil winding process of a respective MRI magnet is order to determine a radial spacer thickness, placement, and so forth for a given winding operation.

Figure 9:
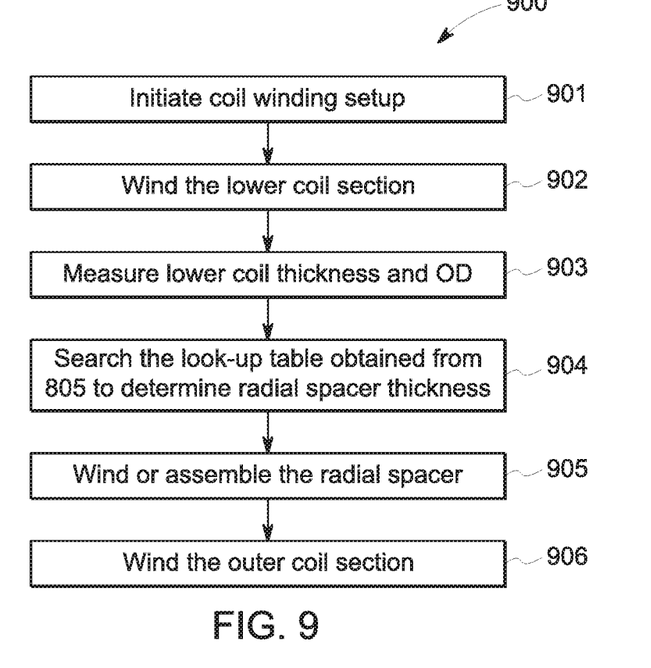
FIG. 9 is a flow chart of a superconducting coil winding workflow, in accordance with an embodiment of the present disclosure.

Proceeding to FIG. 9, a flow chart is illustrated showing steps of a coil winding workflow 900 that may be employed in the fabrication of a magnetic coil that may be used in a system such as an MR imaging system. At block 901 a coil winding setup is initiated. The coil winding setup may include initiating or parameterizing a machine that will be used to wind the superconducting coils of an MRI magnet and providing the necessary inputs (e.g. coil material) into the machine for it to begin the coil winding process. The coil winding workflow may wind the sections of an MRI magnet starting from a radially inward position to a radially outward position. That is, the coil winding may first wind one or more radially inward section(s) and then proceed to winding one or more radially outward section(s). At block 902, the lower superconducting coil section is wound. The lower superconducting coil section may refer to the section of a MRI magnet that is radially closer to the magnetic isocenter of the MRI magnet. At block 903, the lower coil thickness and outer diameter is measured or otherwise determined. Due to variations in the geometry of the inner coil that may be introduced in the coil winding process, the inner coil's outer diameter and radial thickness may be measured in order to determine if the inner coil's geometry is as was intended per the planned design characteristics. If the inner coil is thicker than the thickness that was intended in its design, then the radial gap that was determined from the magnet design workflow 800 may be reduced in order to preserve the magnetic isocenter of the whole coil. Conversely, if the measured inner coil is thinner than was intended in its design, then the radial gap that was determined from the magnet design workflow 800 may be enlarged to preserve the EM center of the whole coil. That is, after measuring the inner coil thickness and outer diameter, a radial gap may be reduced or enlarged based upon how the measurements compare with what was designed. With this in mind, and as shown by way of example in FIG. 9, at block 904, the table of nominal inner coil thickness values mapped to optimal radial spacer thickness values, which was outputted in block 805 of FIG. 8, may be searched to obtain a desired radial spacer thickness. Having determined a preferred radial spacer thickness, at block 905, the radial spacer may be wound or assembled. After winding the radial spacer, at block 906, the outer coil section may be wound.

As may be appreciated, the process flow illustrated in FIG. 8 is simplified for the purpose of illustration to describe incorporation of a single radial spacer. As discussed herein, multiple spacers may be provided in a given magnetic coil stack. In such contexts, certain steps of FIG. 8 may be iterated or looped, such as to measure a given radial winding thickness, determine a radial spacer thickness or geometry, form a spacer within a radial stack, and continue with the winding process. That is, the steps shown in FIG. 8 are not limited to a single adjustable spacer workflow. Magnetic design workflow 800 or a derivation of it may be used to wind MRI magnets with multiple adjustable radial spacers. Further, as noted herein, a radial gap and corresponding spacer of a determined suitable geometry may be designed in one or more of the main superconducting coils or of the shielding/bucking coils or in a combination of both the main superconducting coils and the shielding/bucking coils. Additionally, in certain aspects is may be suitable to design and/or form the radial spacer(s) within the small and medium (axially innermost) main superconducting coils. Moreover, the radial spacer may, in certain implementations, be positioned at a location that is greater than or equal to the fifty percent of the radial thickness position measured from the inner coil's inner surface.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:

1. A magnetic resonance (MR) imaging system, comprising:
    an MR scanner communicatively coupled to control and analysis circuitry, wherein the MR scanner comprises:
    a plurality of main coil windings configured to generate a primary magnetic field along a magnetic isocenter of the MR scanner;
    one or more shielding coil windings configured to generate a shielding magnetic field with respect to the primary magnetic field;
    wherein at least one coil winding of one or both of the main coil windings or shielding coil windings comprises one or more radial gaps dividing the respective coil winding into at least an inner coil winding segment and an outer coil winding segment; and
    a radial spacer located in each radial gap, wherein one or more of the size, geometry, or composition of the respective radial spacers are selected to preserve the homogeneity of the magnetic field along the magnetic isocenter during operation;
    wherein at least a first coil winding of the main coil windings comprises two or more radially offset radial gaps and corresponding radial spacers within each radial gap.

2. The MR imaging system of claim 1, wherein a respective radial gap within the main coil windings or the shielding coil windings is defined by an outer diameter corresponding to the outer coil winding segment's inner surface and an inner diameter corresponding to the inner coil winding segment's outer surface.

3. The MR imaging system of claim 1, wherein at least a first coil winding of the main coil windings comprise a radial gap and corresponding radial spacer.

4. The MR imaging system of claim 1, wherein each coil windings of the main coil windings comprise at least one radial gap and corresponding radial spacer.

5. The MR imaging system of claim 1, wherein each coil windings of the main coil windings comprise two or more radially offset radial gaps and corresponding radial spacers.

6. The MR imaging system of claim 1, wherein the radial spacers are composed of fiberglass soaked with epoxy or porous fiberglass reinforced panels (FRP) sheets infused with epoxy.

7. The MR imaging system of claim 1, wherein the plurality of main coil windings are composed of a superconducting magnetic material.

8. A method for magnetic coil design comprising the steps of:
    executing one or more magnetic design analysis routines based on one or more magnet design inputs, wherein the magnet design inputs comprise performance characteristics for a target magnetic field;
    obtaining as an output of the one or more magnetic design analysis routines a respective geometry of each magnetic coil of a plurality of coils of a magnetic coil structure to be fabricated; and
    based on the respective geometry of each magnetic coil of the plurality of coils, determining a geometry of two or more radial gaps to be formed within one or more magnetic coils of the plurality of coils so as to maintain magnetic field homogeneity of the magnetic coil structure during operation.

9. The method of claim 8, wherein the steps of executing one or more magnetic design analysis routines, obtaining outputs of the one or more magnetic design analysis routines, and determining geometries of two or more radial gaps to be formed within one or more magnetic coils of the plurality of coils are repeated for a plurality of magnet design inputs so as to generate a look up table of radial gap geometries for different magnet design inputs.

10. The method of claim 8, further comprising determining one or more of a size, composition, or geometry of a radial spacer to be formed in each radial gap.

11. The method of claim 8, wherein the respective geometry of each radial gap comprises a radial offset of the respective gap and a radial thickness of the respective gap.

12. The method of claim 8, wherein the target magnetic field is a primary magnetic field of a magnetic resonance imaging system.

13. The method of claim 8, wherein the target magnetic field is a shielding magnetic field of a magnetic resonance imaging system.

14. A method for winding a magnetic coil structure, the method comprising:
    for a first magnetic coil of the magnetic coil structure, winding a first coil segment having a first inner diameter and a first outer diameter;
    measuring one or both of a thickness of the first coil segment or the first outer diameter of the first coil segment;
    based on the thickness or the first outer diameter, determining a thickness of a radial gap to be formed in the first coil segment;

forming a radial spacer in the radial gap, wherein thickness of the radial spacer corresponds to the radial gap thickness;

winding a second coil segment over the radial spacer, wherein the second coil segment has a second inner diameter and a second outer diameter; and forming two or more radial gaps and corresponding radial spacers in one or more pairs of coils of the magnetic coil structure to maintain magnetic field homogeneity of the magnetic coil structure during operation.

15. The method of claim 14, further comprising consulting a look up table of radial gap geometries using the thickness of the first coil segment or the first outer diameter of the first coil segment to determine the thickness of the radial gap to be formed in the respective coil segment.

16. The method of claim 14, further comprising adjusting the thickness of the radial gap to be thicker or thinner based upon the measured thickness of the first coil segment to maintain magnetic field homogeneity of the magnetic coil structure during operation.

17. The method of claim 14, further comprising forming one or more superconducting joints between the first coil segment and the second coil segment to electrically connect the first coil segment and the second coil segment that are divided by the radial spacer.

18. The method of claim 14, wherein forming the radial spacer comprises forming the radial spacer from one of fiberglass soaked with epoxy or porous fiberglass reinforced panels (FRP) sheets infused with epoxy.

* * * * *